United States Patent [19]

Hong et al.

[11] Patent Number: 5,753,560
[45] Date of Patent: May 19, 1998

[54] METHOD FOR FABRICATING A SEMICONDUCTOR DEVICE USING LATERAL GETTERING

[75] Inventors: Stella Q. Hong, Gilbert; Thomas A. Wetteroth, Chandler; Syd Robert Wilson, Phoenix, all of Ariz.

[73] Assignee: Motorola, Inc., Schaumburg, Ill.

[21] Appl. No.: 740,580

[22] Filed: Oct. 31, 1996

[51] Int. Cl.$^6$ ............................................. H01L 21/322
[52] U.S. Cl. ..................... 438/402; 438/162; 438/473
[58] Field of Search ............................ 438/143, 162, 438/402, 407, 471, 473, 517

[56] References Cited

U.S. PATENT DOCUMENTS

| | | | |
|---|---|---|---|
| 4,249,962 | 2/1981 | Celler | 438/473 |
| 5,194,394 | 3/1993 | Wada | 438/402 |
| 5,244,819 | 9/1993 | Yue | 438/402 |
| 5,308,776 | 5/1994 | Gotou | 438/517 |
| 5,376,560 | 12/1994 | Aronowitz et al. | 438/407 |
| 5,453,153 | 9/1995 | Fan et al. | 117/2 |
| 5,557,134 | 9/1996 | Sugisaka et al. | 257/506 |

OTHER PUBLICATIONS

S. Koveshnikov et al., "Defect Engineering for Silicon-on--Insulator, MeV Implantation and Low Temperature Processing", Solid State Phenomena, vol., 47–48, 1996, pp. 183–194.

T.I. Kamins et al., "Heavy Metal Gettering in Implanted Buried-Oxide Structures", Mat. Res. Soc. Symp. Proc., vol. 53, 1986, pp. 239–244.

J. Jablonski et al., "Gettering Layer Formation in Low-Dose Simox Wafers", Proceedings 1995 IEEE International SOI Conference, Oct. 1995, pp. 34, 35.

J. Jablonski et al., "Heavy Metal Gettering in Simox Wafers" Electrochemical Society Proceedings, vol. 94–11, 1994, pp. 28–37.

J. Jablonski et al., "Gettering of Cu and Ni Impurities in SIMOX Wafers", J. Electrochem. Soc., vol. 142, No. 6, Jun. 1995, pp. 2059–2066.

Electronics Letters, "Mechanism of Carrier Lifetime Increase in ION Beam Synthesised SOI Structures", vol. 22, No. 20, Sep. 25, 1986, pp. 1062–1064.

W. Skorupa et al., "Proximity Gettering of Transition Metals in Separation by Implanted Oxygen Structures", Applied Physics Letter, vol. 67, No. 20, Nov. 13, 1995, pp. 2992–2994.

M. Delfino et al., "Gettering of Copper In Silicon-on-Insulator Structures Formed by Oxygen Ion Implantation", J. Electrochem. Soc.:Solid-State Science and Technology, vol. 134, No. 8, Aug. 1987, pp. 2027–2030.

M. Shabani et al., "Simox Side or Polysilicon Backside Which is the Stronger Gettering Side for the Metal Impurities", Electrochemical Society Proceedings, vol. 96–3, 1996, pp. 162–175.

L. Mulestagno et al., "Gettering of Copper in Bonded Silicon Wafers", Electrochemical Society Proceedings, vol. 96–3, 1996, pp. 176–183.

*Primary Examiner*—Chandra Chaudhari
*Attorney, Agent, or Firm*—Ziye Zhou

[57] ABSTRACT

A semiconductor structure (20) includes a silicon layer (16) formed on an oxide layer (14). Gettering sinks (31, 32) are formed in the silicon layer (16). Lateral gettering is performed to effectively remove impurities from a first section (26) of the semiconductor layer (16). An insulated gate semiconductor device (40) is then formed in semiconductor layer (16), wherein a channel region (55) of the device (40) is formed in the first section (26) of the semiconductor layer (16). A gate dielectric layer (42) of the device (40) is formed over a portion of the first section (26) after the lateral gettering process, thereby enhancing the integrity of the gate dielectric layer (42).

20 Claims, 4 Drawing Sheets

METHOD FOR FABRICATING A SEMICONDUCTOR DEVICE USING LATERAL GETTERING

BACKGROUND OF THE INVENTION

The present invention relates, in general, to semiconductor device fabrication and, more particularly, to impurity gettering in semiconductor device fabrication.

The performance of a semiconductor device is affected by impurities in the semiconductor substrate on which the semiconductor device is fabricated. For example, the presence of metallic impurities such as copper, nickel, iron, chromium, molybdenum, etc. tends to introduce generation-recombination centers in the energy band gap and degrade the integrity of the oxide layer formed on the semiconductor substrate, thereby affecting the performance of the semiconductor device. Impurity gettering can be performed to reduce impurities in a region of the semiconductor substrate where the semiconductor device is fabricated. Conventionally, impurity gettering includes intrinsic gettering and extrinsic gettering processes.

In an intrinsic gettering process, gettering sinks, such as crystal defects or oxygen precipitates, are formed in the semiconductor substrate at a distance from the front side of the substrate, wherein the distance is greater than the depth of semiconductor devices fabricated in the substrate. The substrate is heated to aid the diffusion of impurities in the substrate. As the impurities diffuse, they are trapped or absorbed by the gettering sinks. In an extrinsic gettering process, a gettering sink, such as a polycrystalline silicon layer, is formed on the backside of the substrate. The semiconductor substrate is heated to aid the diffusion of impurities in the substrate. As the impurities diffuse, they are trapped or absorbed by the gettering sink formed on the backside. Therefore, after either the intrinsic or the extrinsic process, the impurity concentration near the front side of the substrate decreases.

However, the gettering processes described herein are ineffective in reducing certain impurities in a semiconductor-on-insulator substrate. A semiconductor device fabricated on a semiconductor-on-insulator substrate typically extends from the front side of the substrate to the buried insulator layer. Accordingly, the gettering sinks, either intrinsic or extrinsic, are formed below the buried insulator layer, which is a diffusion barrier to some impurities in the substrate. In a conventional fabrication process in which the temperature of the substrate reaches approximately 1000 degrees Celsius (°C.), the diffusivities of some impurities, such as iron, chromium, molybdenum, etc., are not high enough to overcome the diffusion barrier and reach the gettering sink below the buried insulator layer. These impurities remain in an active region of the substrate and may affect the performance of a semiconductor device fabricated therein.

Accordingly, it would be advantageous to have a method for fabricating a semiconductor-on-insulator device. It is desirable for the method to effectively remove impurities from the region in a semiconductor-on-insulator substrate where a semiconductor device is formed. It is also desirable for the method to enhance the integrity of gate oxide of an insulated gate semiconductor device.

BRIEF DESCRIPTION OF THE DRAWINGS

It should be noted that the same reference numbers are used in the figures to represent the same elements.

DETAILED DESCRIPTION OF THE DRAWINGS

Generally, the present invention provides a method for laterally gettering impurities in a semiconductor substrate. The lateral gettering process is part of a fabrication process for fabricating a semiconductor device such as, for example, an insulated gate field effect transistor, an insulated gate bipolar transistor, a bipolar transistor, a capacitor, a resistor, etc. While applicable to impurity gettering in both bulk semiconductor and semiconductor-on-insulator device fabrication, the lateral gettering process of the present invention is specially beneficial in the fabrication of a semiconductor-on-insulator device. When fabricating a semiconductor-on-insulator device in accordance with the present invention, localized gettering sinks are formed in the semiconductor layer in which the semiconductor-on-insulator device is formed. Impurities in the semiconductor layer do not need to diffuse through the buried insulator layer in the semiconductor-on-insulator substrate to reach the gettering sinks. Therefore, the gettering process is effective in gettering impurities in a region where the semiconductor-on-insulator device is formed. When fabricating an insulated gate semiconductor device in accordance with the present invention, the lateral gettering process is performed prior to the formation of the gate dielectric layer. Accordingly, the integrity of the gate dielectric layer is enhanced compared with prior art processes.

Figure 1:
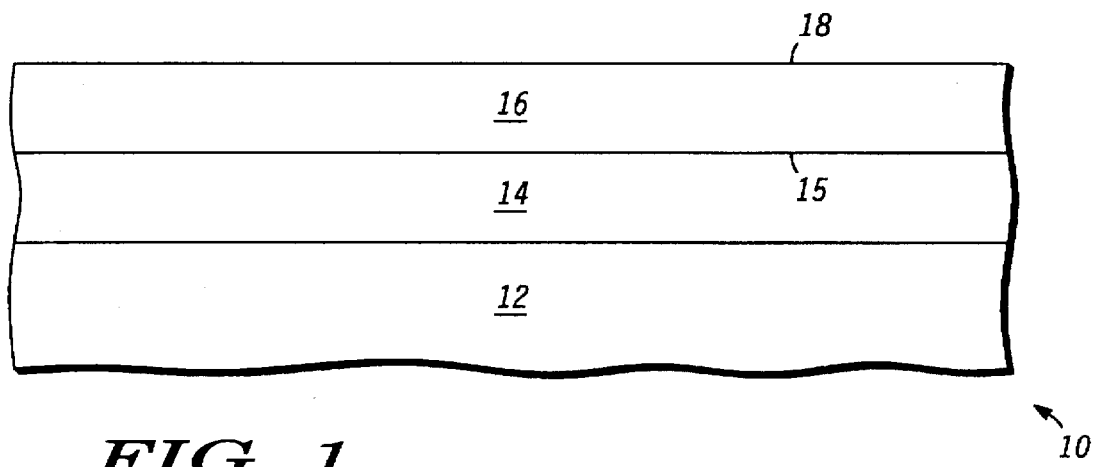
FIG. 1 is an enlarged cross-sectional view of a portion of a semiconductor substrate such as would be used to fabricate a semiconductor device in accordance with the present invention.

FIG. 1 is an enlarged cross-sectional view of a portion of a semiconductor substrate 10 such as would be used to fabricate a semiconductor device in accordance with the present invention. By way of example, semiconductor substrate 10 is a silicon-on-insulator (SOI) substrate. SOI substrate 10 includes a substrate layer 12, which has an insulator layer 14 formed thereon. Insulator layer 14 has a surface 15. A silicon layer 16 is formed on insulator layer 14. Thus, surface 15 is also referred to as an interface between silicon layer 16 and insulator layer 14. Silicon layer 16 has a major surface 18 opposite to interface 15. By way of example, insulator layer 14 is a silicon dioxide layer and is also referred as a buried oxide layer. SOI substrate 10 can be formed using any of the conventional processes known in the art such as, for example, oxygen implantation or direct wafer bonding and thinning.

Figure 2:
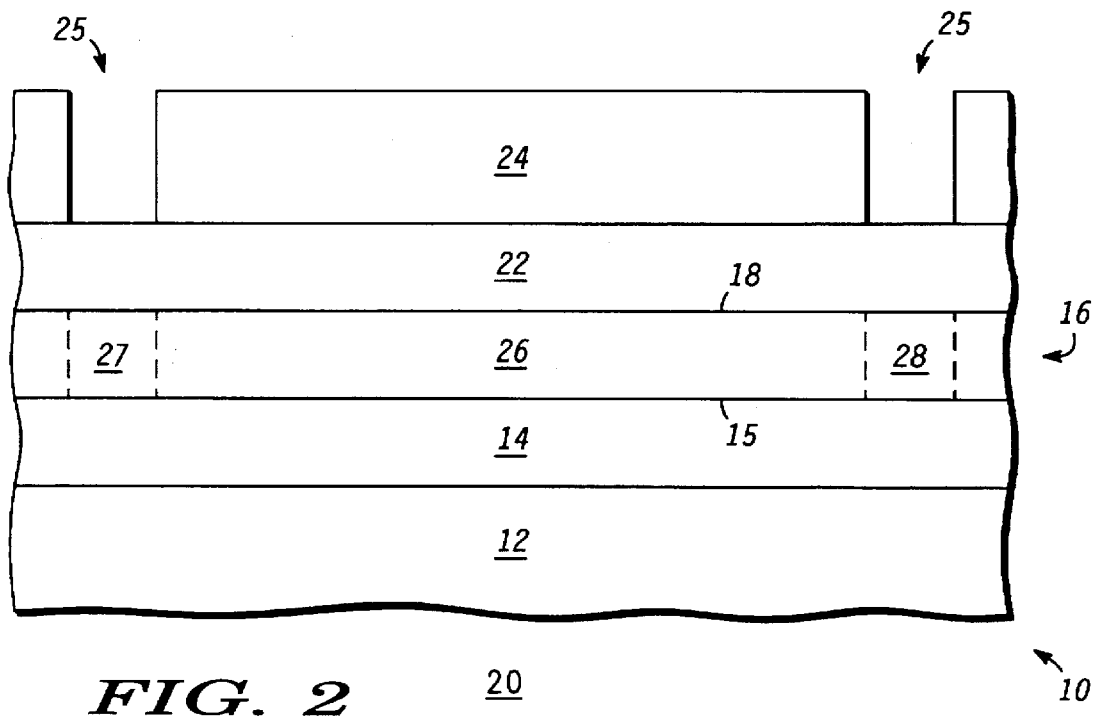
FIGS. 2 and 3 are enlarged cross-sectional views of a semiconductor structure at various stages of a lateral gettering process in accordance with a first embodiment of the present invention.

FIG. 2 is an enlarged cross-sectional view of a semiconductor structure 20 at an early stage of a lateral gettering process in accordance with a first embodiment of the present invention. Structure 20 is fabricated using SOI substrate 10 of FIG. 1.

A dielectric layer 22 is formed on major surface 18 of silicon layer 16. By way of example, dielectric layer 22 is a layer of oxide and is also referred to as a sacrificial dielectric layer or a sacrificial oxide layer. Techniques of forming a dielectric layer on a semiconductor layer are well known in the art. A masking layer 24 such as, for example, a photoresist layer, is formed on sacrificial dielectric layer 22. Masking layer 24 is patterned to have openings 25, thereby exposing portions of sacrificial dielectric layer 22. By way of example, masking layer 24 is patterned using photolithography techniques that are well known to those skilled in the art. Masking layer 24 overlies a section 26 in silicon layer 16 and does not overlie sections 27 and 28 in silicon layer 16. In subsequent process steps, gettering sinks are formed in sections 27 and 28, and impurities in section 26 are gettered to the gettering sinks in sections 27 and 28. As shown in FIG. 2, sections 26, 27, and 28 are adjacent major surface 18 of silicon layer 16. Further, section 26 is laterally displaced from sections 27 and 28 in a direction parallel to major surface 18.

Sacrificial dielectric layer 22 serves to protect major surface 18 of silicon layer 16 during a subsequent ion implantation process. It should be understood that forming sacrificial dielectric layer 22 is optional in accordance with the present invention. In an alternative embodiment, masking layer 24 is formed directly over major surface 18 of silicon layer 16.

Silicon ions are selectively implanted into sections 27 and 28 of silicon layer 16 through openings 25 in masking layer 24 and through sacrificial dielectric layer 22. The implanted ions heavily damage or amorphize sections 27 and 28 of silicon layer 16. The dose and energy of the silicon ion implantation are adjusted to control the ion implantation profile. Preferably, the peak of the ion implantation profile falls in silicon layer 16 and the implanted ions are sufficient to heavily damage or substantially amorphize sections 27 and 28, which extend from major surface 18 to interface 15. For example, if silicon layer 16 has a thickness of approximately 100 nanometers (nm) and sacrificial dielectric layer 22 has a thickness of approximately 150 nm, the silicon ion implantation preferably has a dose ranging from approximately $5 \times 10^{14}$ ions per square centimeter (ions/cm$^2$) to approximately $2 \times 10^{16}$ ions/cm$^2$ and an energy ranging from approximately 100 kilo-electronvolts (keV) to approximately 170 keV.

It should be understood that the ions used in the ion implantation process are not limited to being silicon ions. For example, other suitable ions for the ion implantation include the ions of a chemical element selected from germanium, carbon, tin, lead, nitrogen, fluorine, hydrogen, helium, neon, argon, krypton, xenon, etc. In accordance with the present invention, the implanted ions preferably do not significantly affect the electrical characteristics of silicon layer 16.

Figure 3:
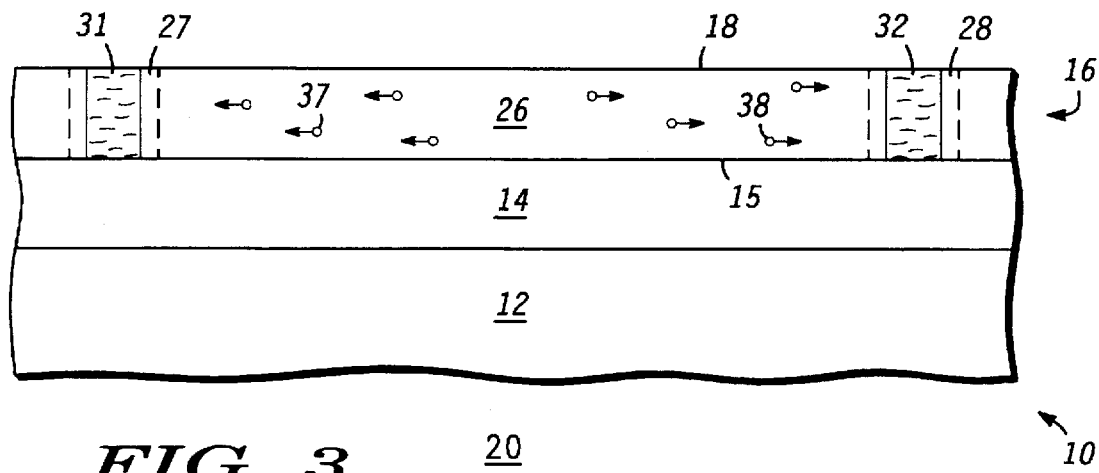

Referring now to FIG. 3, masking layer 24 and sacrificial dielectric layer 22 (shown in FIG. 2) are removed using techniques well known in the art. Semiconductor structure 20 is placed in an elevated temperature environment such as, for example, a furnace, in an annealing process. At the elevated temperature, recrystallization takes place in sections 27 and 28. The rate of recrystallization depends on the temperature of semiconductor structure 20. By way of example, the temperature of semiconductor structure 20 is maintained at a temperature between approximately 500 degrees Celsius (°C.) and approximately 1000° C. during the annealing process. The recrystallization or crystal regrowth process originates from the boundaries between section 26 and sections 27 and 28. The implanted ions displace the silicon atoms which form crystal defect regions 31 and 32 within sections 27 and 28, respectively. Crystal defect regions 31 and 32 serve as gettering sinks in silicon layer 16.

It should be understood that gettering sinks 31 and 32 are not limited to being formed through implanting ions into sections 27 and 28, and recrystallizing the silicon in sections 27 and 28. Gettering sinks 31 and 32 may be formed by any process which creates localized defects or localized non-single crystal regions in silicon layer 16. For example, gettering sinks 31 and 32 may be formed by a sputtering process.

The elevated temperature also increases the diffusivities of impurities in silicon layer 16. In other words, the elevated temperature aids the diffusion of the impurities in silicon layer 16. FIG. 3 shows impurity atoms 37 and 38 as two representative impurity atoms in silicon layer 16. Impurity atoms 37 and 38 represent any types of impurity atoms that may exist in silicon layer 16, which may include impurity atoms of copper, nickel, iron, chromium, molybdenum, etc. In the diffusion process, the impurities in section 26 diffuse into sections 27 and 28, where they are absorbed or trapped by gettering sinks 31 and 32. Therefore, the impurity diffusion process reduces the impurity concentration in section 26 of silicon layer 16. Because the impurity atoms, such as impurity atoms 37 and 38, diffuse substantially in a lateral direction parallel to major surface 18 of silicon layer 16, the gettering process is referred to as a lateral gettering process. As those skilled in the art are aware, although majority of impurity atoms diffuse substantially in the lateral direction, some impurity atoms may diffuse in a slightly inclined direction. For example, an impurity atom may diffuse in an inclined direction from a portion of section 26 near major surface 18 to a portion of gettering sink 31 near interface 15.

Preferably, the lateral gettering process continues until the impurity concentration in section 26 of silicon layer 16 is sufficiently low so that it does not significantly affect the performance of the device formed in section 26. In other words, the lateral gettering process preferably continues until section 26 of silicon layer 16 is substantially free of impurities. As the temperature increases, the diffusivities of the impurity atoms increase and, therefore, the required time for the gettering process decreases. For example, when structure 20 is used to fabricate a semiconductor device having a dimension of approximately 5 micrometers (μm) and the annealing temperature is approximately 900° C., the gettering process preferably lasts for approximately one hour.

It should be understood that the steps of removing masking layer 24, removing sacrificial dielectric layer 22, forming gettering sinks 31 and 32, and gettering impurities to gettering sinks 31 and 32 are not limited to being performed in the same order as described herein before with reference to FIG. 3. In alternative embodiments of the present invention, the step of removing sacrificial dielectric layer 22 is performed after the step of forming crystal defect regions 31 and 32 or after the step of impurity gettering. It should also be understood that the steps of removing masking layer 24, removing sacrificial dielectric layer 22, forming gettering sinks 31 and 32, and gettering impurities to gettering sinks 31 and 32 are not limited to being performed consecutively to each other. For example, a step of channel dopant implantation may be performed after the step of removing masking layer 24 and prior to the step of removing sacrificial dielectric layer 22.

Figure 4:
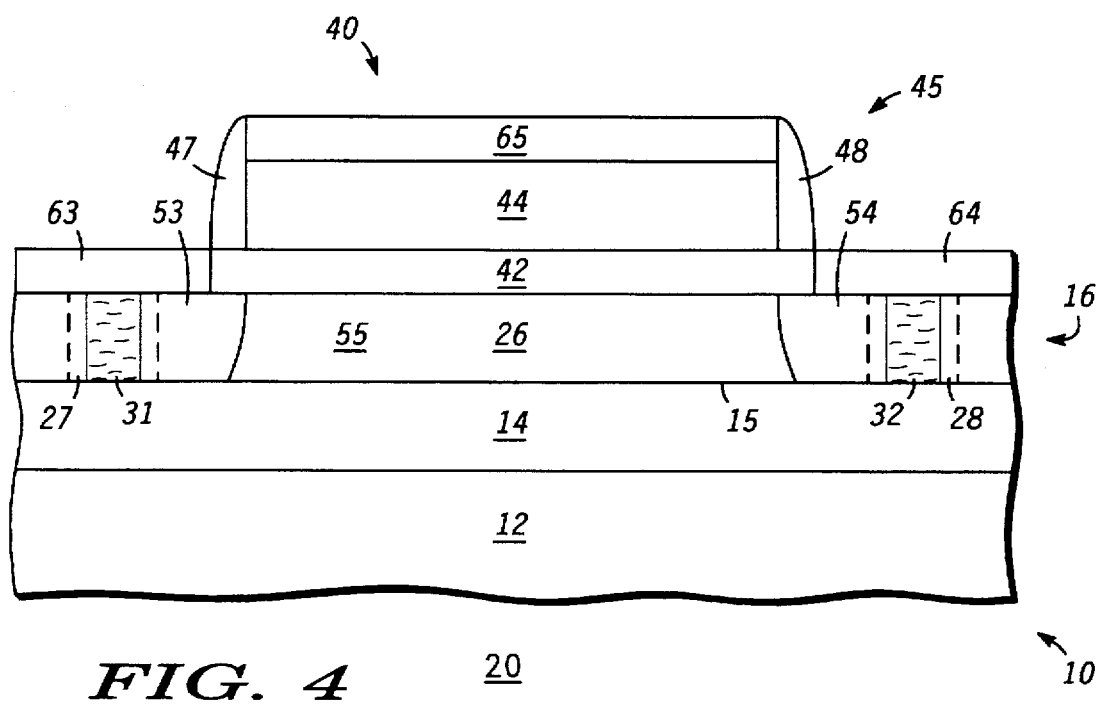
FIG. 4 is an enlarged cross-sectional view of a semiconductor device fabricated using the semiconductor structure of FIG. 3.

FIG. 4 is an enlarged cross-sectional view of a semiconductor device 40 fabricated using semiconductor structure 20 of FIG. 3. By way of example, semiconductor device 40 is an n-channel insulated gate field effect transistor (FET) formed on SOI substrate 10.

To form FET 40, a dopant of p-type conductivity such as, for example, boron, is implanted into section 26 of silicon layer 16. The energy and dose of the implanted boron ions are adjusted so that the silicon material in section 26 has a dopant concentration ranging, for example, from approximately $1 \times 10^{15}$ atoms per cubic centimeter (atoms/cm$^3$) to approximately $6 \times 10^{18}$ atoms/cm$^3$. A dielectric layer 42 is formed on a portion of major surface 18 of silicon layer 16. A conductive layer such as, for example, a polycrystalline silicon layer 44 of n-type conductivity, is formed on dielectric layer 42. Dielectric layer 42 and polycrystalline silicon layer 44 form a gate structure 45 of FET 40. By way of example, dielectric layer 42 is an oxide layer and is also referred to as a gate dielectric layer or a gate oxide layer. It should be noted that gate structure 45 is not limited to being formed by polycrystalline silicon layer 44 and dielectric layer 42. For example, in an alternative embodiment of the present invention, gate structure 45 includes a metal layer formed on gate dielectric layer 42. Insulating structures such as, for example, oxide spacers 47 and 48, are formed adjacent gate structure 45. A dopant of n-type conductivity such as, for example, arsenic, is implanted into silicon layer 16 adjacent oxide spacers 47 and 48 to form source region 53 and drain region 54, respectively, of FET 40. The energy and dose of the implanted arsenic ions are adjusted so that the silicon material in source region 53 and drain region 54 has a dopant concentration ranging, for example, from approximately $1 \times 10^{18}$ atoms/cm$^3$ to approximately $1 \times 10^{21}$ atoms/cm$^3$. A region below gate structure 45 serves as a channel region 55 of FET 40. FET 40 further includes a source electrode 63 electrically coupled to source region 53, a drain electrode 64 electrically coupled to drain region 54, and a gate electrode 65 electrically coupled to polycrystalline silicon layer 44 of gate structure 45. By way of example, source electrode 63, drain electrode 64, and gate electrode 65 are silicide structures.

FIG. 4 shows that source region 53 is partially in section 26 and partially in section 27. FIG. 4 also shows that drain region 54 is partially in section 26 and partially in section 28. These are not intended as limitations of the present invention. In accordance with the present invention, channel region 55 of FET 40 is preferably located within section 26 of silicon layer 16. Further, the boundary between source region 53 and channel region 55 and the boundary between drain region 54 and channel region 55 are preferably in section 26. Therefore, channel region 55 of FET 40 is substantially free of impurities after the gettering process described herein before with reference to FIGS. 2 and 3.

Accordingly, source region 53 is preferably at least partially in section 26, and drain region 54 is preferably at least partially in section 26.

In accordance with the present invention, gate dielectric layer 42 of FET 40 is formed after the lateral gettering process which decreases the impurity concentration in section 26 of silicon layer 16. This unique feature of the present invention guarantees that, when gate dielectric layer 42 is formed, section 26 of silicon layer 16 is substantially free of impurities. Therefore, the integrity of gate dielectric layer 42 is effectively enhanced compared with the prior art processes. It should be understood that the annealing process in the lateral gettering process described with reference to FIGS. 2 and 3 and the process of forming gate dielectric layer 42 may be performed in one combined process step. In the combined process step, structure 20 is placed in an elevated temperature environment, such as a furnace. Recrystallization, impurity diffusion and gettering take place at the elevated temperature. After a time period, preferably sufficient for the gettering process to significantly reduce the impurity concentration in section 26, oxygen is supplied into the furnace to grow gate dielectric layer 42.

Although the process of forming an n-channel insulated gate FET is described herein, this is not intended as a limitation of the present invention. The present invention is also applicable in fabricating a p-channel insulated gate FET, an insulated gate bipolar transistor, a bipolar transistor, a capacitor, a resistor, etc. When fabricating a FET, the channel region, the source-channel junction, and the channel-drain junction of the FET are preferably formed in a region substantially free of impurities after the lateral gettering process. When fabricating a bipolar transistor, the base region, the lightly doped collector region, the emitter-base junction, and the base-collector junction of the bipolar transistor are preferably formed in a region substantially free of impurities after the lateral gettering process. When fabricating an insulated gate semiconductor device, the gettering process is preferably performed prior to the formation of the gate dielectric layer.

Figure 5:
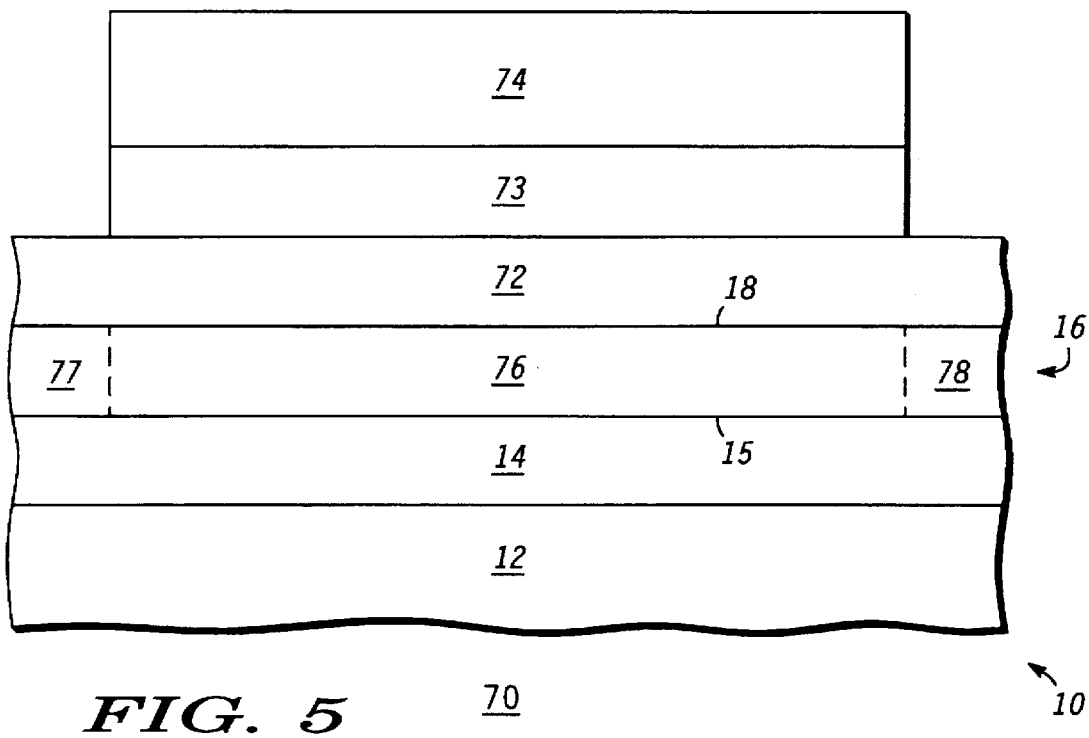
FIGS. 5–8 are enlarged cross-sectional views of a semiconductor structure at various stages of a lateral gettering process in accordance with a second embodiment of the present invention.

FIG. 5 is an enlarged cross-sectional view of a semiconductor structure 70 at an early stage of a lateral gettering process in accordance with a second embodiment of the present invention. Structure 70 is also fabricated using SOI substrate 10 of FIG. 1.

A dielectric layer 72 is formed on major surface 18 of silicon layer 16. By way of example, dielectric layer 72 is a layer of oxide and is also referred to as a pad oxide layer. Techniques of forming a dielectric layer on a semiconductor layer are well known in the art. A layer 73 of nitride is formed on pad oxide layer 72. A masking layer 74 such as, for example, a photoresist layer, is formed on nitride layer 73. Masking layer 74 is patterned to expose portions of nitride layer 73. By way of example, masking layer 74 is patterned using photolithography techniques that are well known to those skilled in the art. Masking layer 74 overlies a section 76 of silicon layer 16, but does not overlie sections 77 and 78 of silicon layer 16. In subsequent process steps, gettering sinks are formed in sections 77 and 78, and impurities in section 76 are gettered to the gettering sinks in sections 77 and 78. As shown in FIG. 5, section 76 is laterally displaced from sections 77 and 78 in a direction parallel to major surface 18.

Pad oxide layer 72 serves to reduce the stress of major surface 18 of silicon layer 16 caused by the formation of nitride layer 73. It should be understood that forming pad oxide layer 72 is optional in accordance with the present invention. In an alternative embodiment, nitride layer 73 is formed directly over major surface 18 of silicon layer 16.

Portions of nitride layer 73 that are unprotected by masking layer 74 are etched away in an etching process that preferably has a higher etch selectivity to oxide than to nitride. By way of example, nitride layer 73 is etched in a reactive ion etching process using a fluorine-containing gas as the etchant.

Silicon ions are selectively implanted into sections 77 and 78 of silicon layer 16 which are unprotected by masking layer 74 and nitride layer 73. The implanted ions heavily damage or amorphize sections 77 and 78 of silicon layer 16. The dose and energy of silicon ion implantation are adjusted to control the ion implantation profile. Preferably, the peak of the ion implantation profile falls in silicon layer 16 and the implanted ions are sufficient to heavily damage or substantially amorphize sections 77 and 78, which extend from major surface 18 to interface 15. It should be understood that, like the ion implantation process described with reference to FIG. 2, the ions used in the ion implantation process are not limited to being silicon ions.

Figure 6:
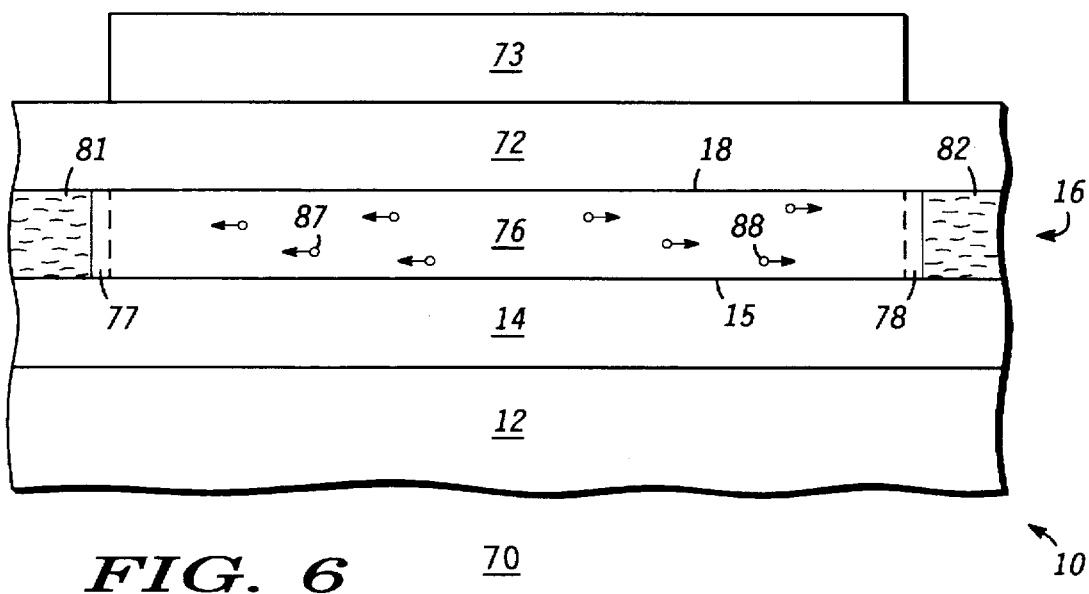

Referring now to FIG. 6, masking layer 74 (shown in FIG. 5) is removed using techniques well known in the art.

Semiconductor structure 70 is placed in an elevated temperature environment to form gettering sinks 81 and 82 in sections 77 and 78, respectively, and to perform impurity gettering. Impurity atoms 87 and 88 are shown in FIG. 6 as two representative impurity atoms in section 76 of silicon layer 16. The processes of forming gettering sinks 81 and 82, and gettering impurities in section 76 are analogous to the processes described with reference FIG. 3.

It should be understood that gettering sinks 81 and 82 are not limited to being formed through ion implantation. Gettering sinks 81 and 82 may be formed by any process which creates localized defects or localized non-single crystal regions in silicon layer 16. In an alternative embodiment, sections 77 and 78 are partially oxidized to form stacking faults, which serve as the gettering sinks. In another alternative embodiment, a sputtering process is used to form the gettering sinks in sections 77 and 78.

Figure 7:
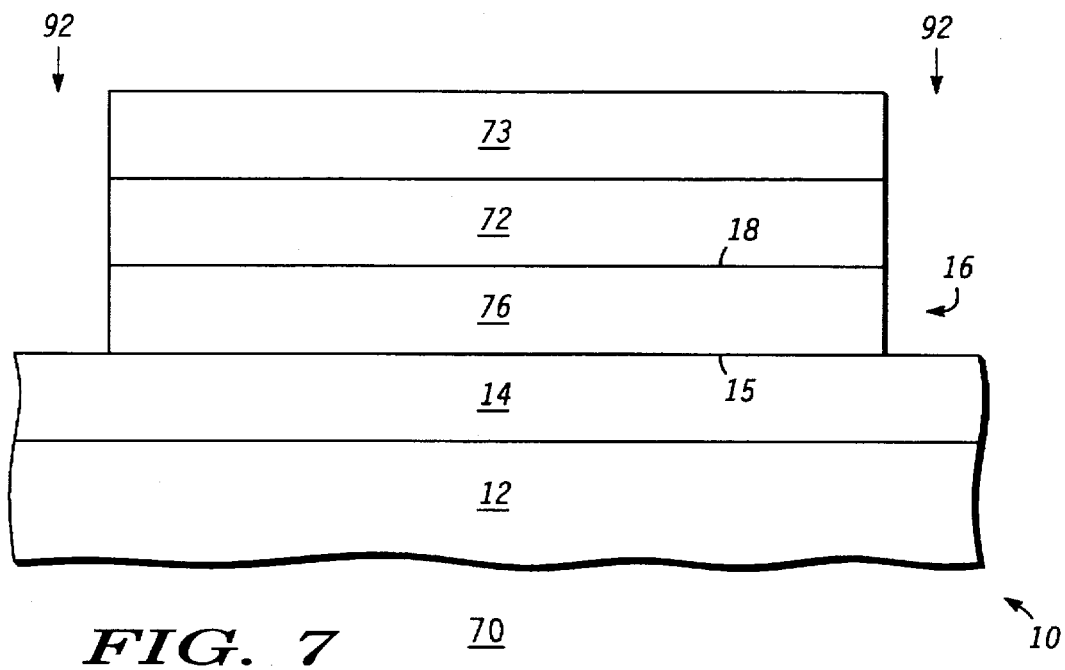

Referring now to FIG. 7, portions of pad oxide layer 72 that are unprotected by nitride layer 73 (shown in FIG. 6) are etched away in an etching process that preferably has a higher etch selectivity to nitride than to oxide. By way of example, pad oxide layer 72 is etched in a wet etching process using buffered hydrofluoric acid as the etchant. The etching process exposes portions of major surface 18 overlying sections 77 and 78 (shown in FIG. 6). The silicon unprotected by nitride layer 73 and pad oxide layer 72 is removed via an etching process which is highly selective to nitride and oxide compared to silicon. For example, a reactive ion etching process using a chlorine-containing gas as the etchant is performed to etch the silicon in sections 77 and 78 (shown in FIG. 6) of silicon layer 16. The etching process forms a trench 92 in the regions where sections 77 and 78 (shown in FIG. 6) of silicon layer 16 were. Because FIG. 7 shows a portion of substrate 10, only portions of trench 92 are shown in FIG. 7.

Figure 8:
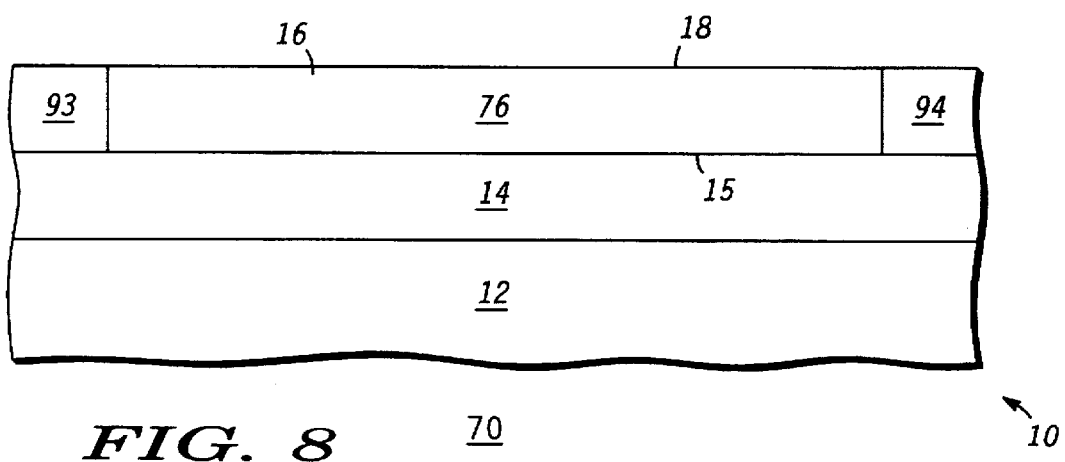

An insulating material, such as silicon dioxide, is deposited over structure 70 of FIG. 7 using a deposition process well known in the art. The deposited oxide (not shown), which fills trench 92 and covers nitride layer 73, is planarized with nitride layer 73 via a chemical mechanical polishing (CMP) process well known in the art. After planarization, nitride layer 73, pad oxide layer 72, and portions of the deposited oxide (not shown) are removed using etching processes well known in the art. The deposited oxide that remains after the etching processes forms field oxide regions 93 and 94 of semiconductor structure 70 as shown in FIG. 8. Field oxide regions 93 and 94 electrically insulate section 76 from other sections (not shown) in silicon layer 16. Therefore, field oxide regions 93 and 94 serve as isolation structures.

Semiconductor structure 70 of FIG. 8 is then used to fabricate a semiconductor device in section 76 of silicon layer 16. The semiconductor device that can be fabricated using structure 70 includes insulated gate field effect transistor, insulated gate bipolar transistor, bipolar transistor, capacitor, resistor, etc. Because the lateral gettering process described with reference to FIG. 6, effectively reduces the impurity concentration in section 76, the device fabricated using structure 70 of FIG. 8 is formed in a region substantially free of impurities. Therefore, the performance of the device is improved. More particularly, when forming an insulated gate semiconductor device in structure 70 of FIG. 8, the integrity of gate dielectric of the device is enhanced compared with the prior art processes.

By now it should be appreciated that a method for fabricating a semiconductor device has been provided. The method includes a lateral gettering process which effectively removes impurities from a region in the semiconductor substrate where a semiconductor device is formed. The lateral gettering process of the present invention is specially effective in gettering impurities in a semiconductor-on-insulator substrate. When fabricating an insulated gate semiconductor device in accordance with the present invention, the lateral gettering process is performed prior to the formation of the gate dielectric layer. Therefore, the integrity of gate dielectric layer is effectively enhanced.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the silicon-on-insulator substrate may be a silicon on sapphire substrate or the like.

We claim:

1. A method for fabricating a semiconductor device, comprising the steps of:

providing a semiconductor substrate;

forming a gettering sink in a first section of the semiconductor substrate, the first section being adjacent a major surface of the semiconductor substrate;

laterally gettering impurities in the semiconductor substrate to the gettering sink to decrease an impurity concentration in a second section of the semiconductor substrate, the second section being laterally displaced from the first section in a direction parallel to the major surface of the semiconductor substrate; and forming the semiconductor device in the second section of the semiconductor substrate after the step of laterally gettering impurities.

2. The method of claim 1, wherein the step of providing a semiconductor substrate includes providing a semiconductor-on-insulator substrate.

3. The method of claim 1, wherein the step of forming a gettering sink includes the steps of:

implanting ions into the first section of the semiconductor substrate; and recrystallizing the first section of the semiconductor substrate to form the gettering sink in the first section of the semiconductor substrate.

4. The method of claim 3, wherein the step of implanting ions includes implanting ions of a chemical element selected from the group consisting of silicon, germanium, carbon, tin, lead, nitrogen, fluorine, hydrogen, helium, neon, argon, krypton, and xenon.

5. The method of claim 1, wherein the step of laterally gettering impurities includes the step of diffusing the impurities in the semiconductor substrate, the impurities being absorbed by the gettering sink in the first section of the semiconductor substrate.

6. The method of claim 1, further comprising the steps of:

removing the first section of the semiconductor substrate to form a trench after the step of laterally gettering impurities and before the step of forming the semiconductor device; and depositing an insulating material into the trench.

7. The method of claim 1, wherein the step of forming the semiconductor device includes the steps of:

forming a gate dielectric layer on the major surface overlying a portion of the second section of the semiconductor substrate after the step of laterally gettering impurities;

forming a conductive layer on the gate dielectric layer;

forming a source region in the semiconductor substrate adjacent the gate dielectric layer, the source region being at least partially in the second section of the semiconductor substrate; and forming a drain region in the semiconductor substrate adjacent the gate dielectric layer, the drain region being at least partially in the second section of the semiconductor substrate.

8. A method for fabricating an insulated gate semiconductor device, comprising the steps of:

providing a semiconductor substrate having a major surface;

forming a gettering sink in a first section of the semiconductor substrate, the first section being adjacent the major surface;

laterally gettering impurities in the semiconductor substrate to the gettering sink in the first section of the semiconductor substrate, thereby decreasing an impurity concentration in a second section of the semiconductor substrate, wherein the second section is laterally displaced from the first section in a direction parallel to the major surface of the semiconductor substrate; and forming a gate dielectric layer on the major surface overlying a portion of the second section of the semiconductor substrate after the step of laterally gettering impurities.

9. The method of claim 8, wherein the step of providing a semiconductor substrate includes the step of providing a semiconductor-on-insulator substrate comprised of a semiconductor layer disposed on an insulator layer, wherein the semiconductor layer has a surface opposite to an interface between the semiconductor layer and the insulator layer, the surface of the semiconductor layer serving as the major surface of the semiconductor substrate.

10. The method of claim 8, wherein the step of forming a gettering sink includes the steps of:

forming a masking layer over the major surface, the masking layer being patterned to have an opening overlying the first section of the semiconductor substrate;

implanting ions into the semiconductor substrate through the opening in the masking layer; and recrystallizing the first section of the semiconductor substrate to form crystal defects in the first section of the semiconductor substrate, the crystal defects serving as the gettering sink.

11. The method of claim 10, wherein the step of implanting ions includes implanting ions of a chemical element selected from the group consisting of silicon, germanium, carbon, tin, lead, nitrogen, fluorine, hydrogen, helium, neon, argon, krypton, and xenon.

12. The method of claim 10, further comprising the steps of:

forming a sacrificial dielectric layer between the major surface and the masking layer; and removing the masking layer and removing the sacrificial dielectric layer after the step of implanting ions.

13. The method of claim 8, wherein the step of laterally gettering impurities includes the steps of:

elevating a temperature of the semiconductor substrate to aid a diffusion of the impurities in the semiconductor substrate; and trapping the impurities in the gettering sink.

14. The method of claim 8, further comprising the steps of:

removing the first section of the semiconductor substrate to form a trench after the step of laterally gettering impurities and prior to the step of forming the gate dielectric layer; and filling the trench with an oxide material.

15. A method for fabricating a semiconductor-on-insulator device, comprising the steps of:

providing a semiconductor-on-insulator substrate comprised of a semiconductor layer disposed on an insulator layer, the semiconductor layer having a major surface opposite to an interface between the semiconductor layer and the insulator layer;

forming a gettering sink in a first section of the semiconductor layer, the first section extending from the major surface to the interface;

heating the semiconductor-on-insulator substrate to increase a diffusivity of impurities in the semiconductor layer;

trapping the impurities in the gettering sink, thereby reducing an impurity concentration in a second section of the semiconductor layer, the second section extending from the major surface to the interface and being laterally displaced from the first section in a direction parallel to the major surface of the semiconductor layer; and forming the semiconductor-on-insulator device in the semiconductor layer after the step of trapping the impurities.

16. The method of claim 15, wherein the step of forming a gettering sink includes the steps of:

forming and patterning a masking layer over the major surface, the masking layer having an opening overlying the first section of the semiconductor layer;

implanting ions into first section of the semiconductor layer through the opening of the masking layer; and recrystallizing the first section of the semiconductor layer to form the gettering sink.

17. The method of claim 16, wherein the step of implanting ions includes implanting ions of a chemical element selected from the group consisting of silicon, germanium, carbon, tin, lead, nitrogen, fluorine, hydrogen, helium, neon, argon, krypton, and xenon.

18. The method of claim 16, wherein the step of forming a gettering sink includes the steps of:

forming a sacrificial dielectric layer on the major surface prior to the step of forming and patterning the masking layer; and removing the masking layer and the sacrificial dielectric layer after the step of implanting ions.

19. The method of claim 15, further comprising the steps of:

removing the first section of the semiconductor layer to form a trench after the step of trapping the impurities and before the step of forming the semiconductor-on-insulator device; and filling the trench with an insulating material.

20. The method of claim 15, wherein the step of forming the semiconductor-on-insulator device includes the steps of:

forming a gate dielectric layer on the major surface overlying a portion of the second section of the semiconductor layer;

forming a conductive layer on the gate dielectric layer;

forming a source region in the semiconductor layer adjacent the gate dielectric layer, the source region being at least partially in the second section of the semiconductor layer; and forming a drain region in the semiconductor layer adjacent the gate dielectric layer, the drain region being at least partially in the second section of the semiconductor layer.

* * * * *